United States Patent
Wang

(10) Patent No.: US 8,004,625 B2
(45) Date of Patent: Aug. 23, 2011

(54) ACTIVE MATRIX SUBSTRATE WITH PRE-CHARGE COMPONENTS AND LIQUID CRYSTAL DISPLAY PANEL THEREOF

(75) Inventor: I-Fang Wang, Changhua County (TW)

(73) Assignee: Wintek Corporation, Taichung (TW)

( * ) Notice: Subject to any disclaimer, the term of this patent is extended or adjusted under 35 U.S.C. 154(b) by 621 days.

(21) Appl. No.: 12/146,408

(22) Filed: Jun. 25, 2008

(65) Prior Publication Data
US 2009/0002584 A1    Jan. 1, 2009

(30) Foreign Application Priority Data

Jun. 26, 2007  (TW) .............................. 96210364 U

(51) Int. Cl.
*G02F 1/136* (2006.01)
*G09G 3/36* (2006.01)
*H01L 29/10* (2006.01)
*H01L 29/15* (2006.01)

(52) U.S. Cl. ................ 349/42; 349/41; 349/43; 349/44; 349/45; 349/46; 345/92; 257/59; 257/72

(58) Field of Classification Search .............. 349/42–48; 345/92; 257/59, 72
See application file for complete search history.

(56) References Cited

U.S. PATENT DOCUMENTS

| | | | | |
|---|---|---|---|---|
| 5,825,343 | A * | 10/1998 | Moon | 345/94 |
| 7,136,057 | B2 * | 11/2006 | Senda et al. | 345/211 |
| 7,193,663 | B2 * | 3/2007 | Shimizu et al. | 349/38 |
| 2008/0067512 | A1 * | 3/2008 | Lee et al. | 257/59 |

* cited by examiner

*Primary Examiner* — Hoan C Nguyen
(74) *Attorney, Agent, or Firm* — Jianq Chyun IP Office

(57) ABSTRACT

An active matrix substrate is provided, which includes a substrate, a plurality of scan lines, data lines, pixel unites, and pre-charge components. The scan lines, data lines and pixel units are all disposed on the substrate. The pixel units are electrically connected with the corresponding scan lines and data lines. Each pixel unit includes an active device and a pixel electrode. The active devices are electrically connected with the scan lines, the data lines and the pixel electrodes. Each pre-charge component is electrically connected with one of the scan lines and two adjacent pixel electrodes controlled by the next scan line. When the pre-charge component is turned on via the scan line electrically connected therewith, the two adjacent pixel electrodes electrically connected with each pre-charge component have the same voltage level so that the two adjacent pixel units are pre-charged.

7 Claims, 5 Drawing Sheets

ACTIVE MATRIX SUBSTRATE WITH PRE-CHARGE COMPONENTS AND LIQUID CRYSTAL DISPLAY PANEL THEREOF

CROSS-REFERENCE TO RELATED APPLICATION

This application claims the priority benefit of Taiwan application serial no. 96210364, filed on Jun. 26, 2007. The entirety of the above-mentioned patent application is hereby incorporated by reference herein and made a part of this specification.

BACKGROUND OF THE INVENTION

1. Field of the Invention

The present invention is related to an active matrix substrate and a display panel, and more particularly to an active matrix substrate and a liquid crystal display (LCD) panel having pre-charge components.

2. Description of Related Art

Currently existing thin-film transistor liquid crystal displays (TFT-LCDs) can be generally classified into poly silicon TFT-LCDs and amorphous silicon TFT-LCDs. Among them, the amorphous silicon TFT-LCDs are commonly adopted by the general public for the advantages, such as a low manufacturing cost and a high yield. LCDs are developed toward having large size and high resolution, and therefore, within each frame time, the charging time assigned to each pixel unit becomes shorter and shorter. When an issue of insufficient charging happens to the pixel units, the display quality of LCDs would significantly worsen.

To solve the aforementioned problem, many driving methods have been provided successively, and one of the driving methods is utilizing a dual scan pulse technique to improve the display quality of LCDs. Such technique performs writing data to each pixel unit mainly via a pre-charge scan pulse and a charge scan pulse. Because of the pre-charge scan pulse, the charge scan signal can quickly charge the pixel units so as to improve the display quality and shorten the response time of LCDs.

However, since such dual scan pulse driving technique is more complicated, TFT-LCDs need to adopt complicated driving ICs so as to achieve both good display quality and fast response time. Therefore, manufacturing LCDs by the dual scan pulse technique requires a higher cost.

SUMMARY OF THE INVENTION

The present invention is to provide an active matrix substrate to mitigate the problem of insufficient charging its pixel units.

The present invention is to provide an active matrix substrate having a feature of pre-charging the pixel units.

The present invention is to provide a liquid crystal display (LCD) panel including the active matrix substrate to mitigate the problem of bad display contrast.

The present invention is to provide an LCD panel including the active matrix substrate to improve the display quality.

The present invention provides an active matrix substrate including a substrate, a plurality of scan lines, a plurality of data lines, a plurality of pixel units and a plurality of pre-charge components. The scan lines, data lines and pixel units are all disposed on the substrate. The pixel units are electrically connected with the corresponding scan lines and data lines, wherein each of the pixel units includes an active device and a pixel electrode. The active device is electrically connected with the scan line and the data line, and the pixel electrode is electrically connected with the active device. Each of the pre-charge components is electrically connected with one of the scan lines and two adjacent pixel electrodes controlled by the next scan line. When each of the pre-charge components is turned on via the scan line electrically connected therewith, the two adjacent pixel electrodes electrically connected with each of the pre-charge components have the same voltage level.

The present invention further provides an LCD panel including the active matrix substrate, an opposite substrate and a liquid crystal layer. The opposite substrate is disposed above the active matrix substrate, and the liquid crystal layer is disposed between the active matrix substrate and the opposite substrate.

The present invention further provides an active matrix substrate including a substrate, a plurality of scan lines, a plurality of data lines, a plurality of common lines and a plurality of pixel units. The scan lines, data lines, common lines and pixel units are all disposed on the substrate. The common lines are arranged between two adjacent scan lines. The pixel units are electrically connected with the corresponding scan lines and data lines, wherein each of the pixel units includes a pixel electrode, an active device and a pre-charge component. In each of the pixel units, the active device is electrically connected with the scan line, the data line and the pixel electrode corresponding to the pixel unit while each of the pre-charge components is electrically connected with the preceding scan line of the pixel unit, the common line and the pixel electrode. When each of the pre-charge components is turned on via the preceding scan line, a plurality of pixel electrodes electrically connected with each of the pre-charge components have the same voltage level as the common line.

The present invention moreover provides an LCD panel including the active matrix substrate, an opposite substrate and a liquid crystal layer. The opposite substrate is disposed above the active matrix substrate, and the liquid crystal layer is disposed between the active matrix substrate and the opposite substrate.

With the plurality of pre-charge components, the pixel units in the LCD panel of the present invention can be pre-charged before liquid crystal molecules are driven so as to mitigate the problem of insufficient charging of pixel units and bad display contrast. Meanwhile, the display quality of the LCD panels is enhanced. In addition, the driving method of the LCD panel of the present invention is simpler than the conventional technique.

In order to make the aforementioned and other objects, features and advantages of the present invention comprehensible, several embodiments accompanied with figures are described in detail below.

DESCRIPTION OF EMBODIMENTS

Figure 1A:
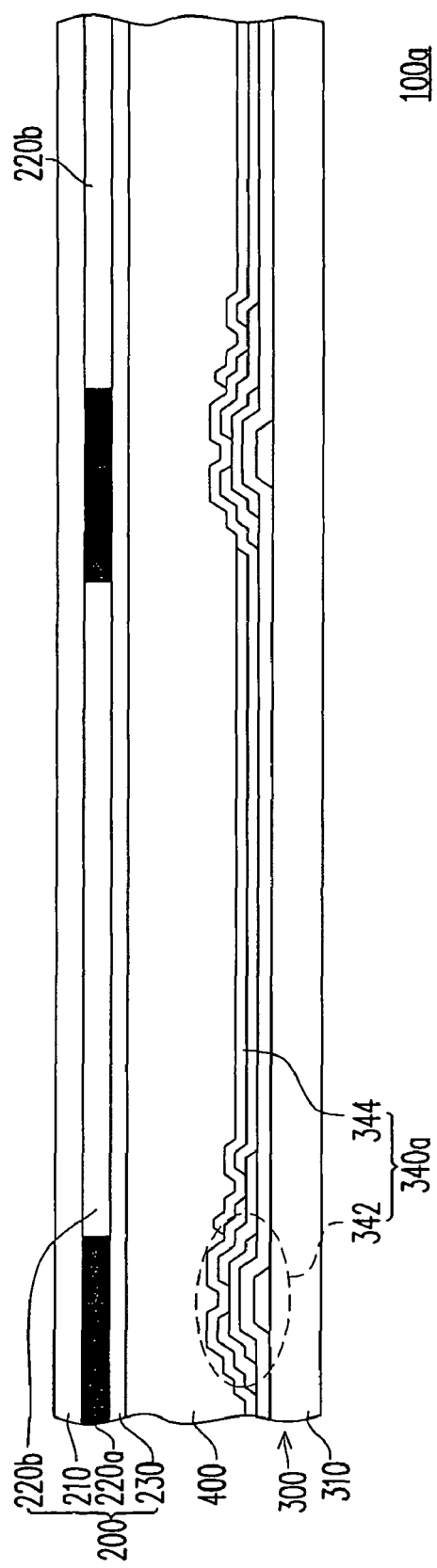
FIG. 1A is a schematic cross-sectional view of a liquid crystal display (LCD) panel according to the first embodiment of the present invention.
Figures 1B, 2:
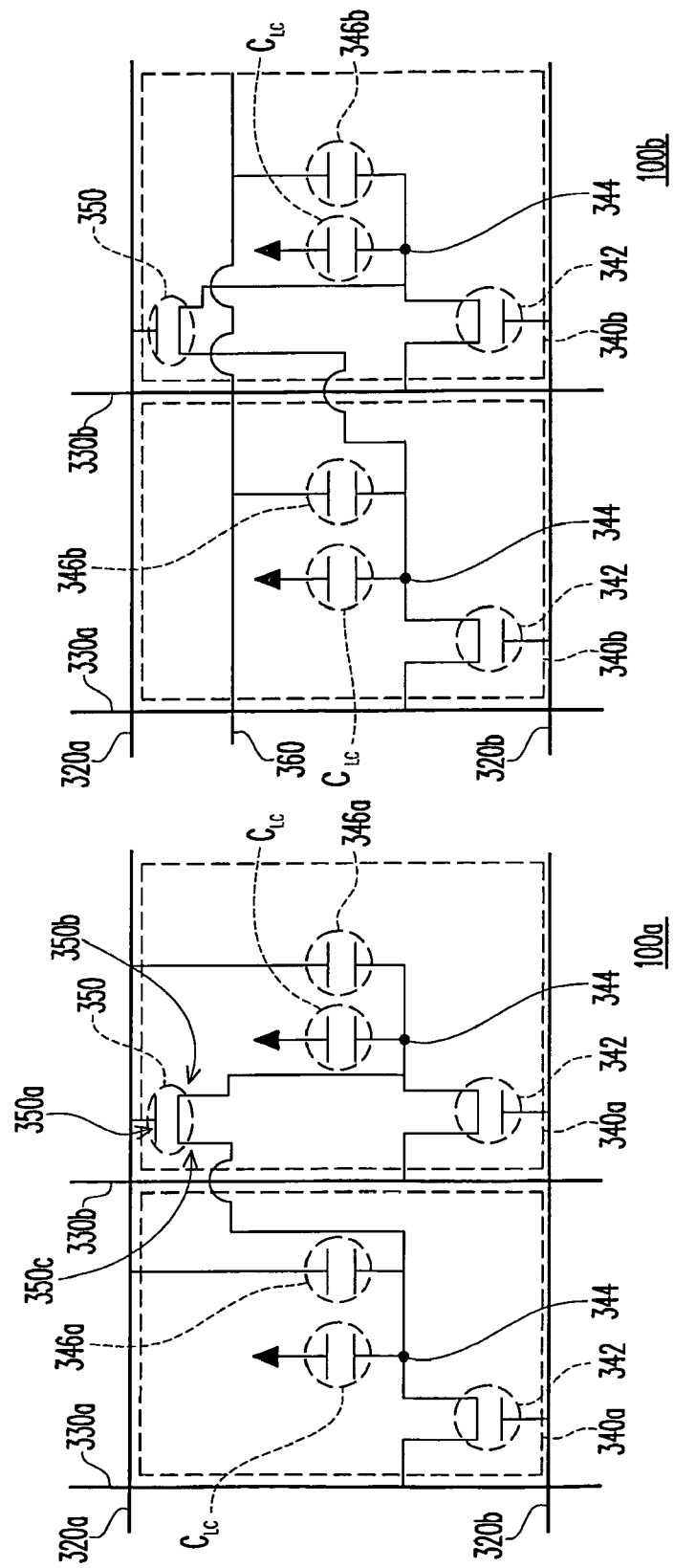
FIG. 1B is a schematic circuit diagram illustrating two adjacent pixel units on the same row of the LCD panel in FIG. 1A.
FIG. 2 is a schematic circuit diagram illustrating two adjacent pixel units on the same row of the LCD panel according to the second embodiment of the present invention.

FIG. 1A is a schematic cross-sectional view of a liquid crystal display (LCD) panel according to the first embodiment of the present invention. FIG. 1B is a schematic circuit diagram illustrating of two adjacent pixel units on the same row of the LCD panel in FIG. 1A. Referring to both FIG. 1A and FIG. 1B, an LCD panel 100a includes an opposite substrate 200, an active matrix substrate 300 and a liquid crystal layer 400. The opposite substrate 200 is disposed above the active matrix substrate 300, and the liquid crystal layer 400 is disposed between the active matrix substrate 300 and the opposite substrate 200.

The opposite substrate 200 is, for example, a color filter array substrate which may include a substrate 210, a black matrix layer 220a, a plurality of color filter patterns 220b and a common electrode 230. The black matrix layer 220a and the plurality of color filter patterns 220b are disposed on the substrate 210, while the common electrode 230 is disposed on the black matrix layer 220a and the color filter patterns 220b.

The active matrix substrate 300 includes a substrate 310, a plurality of scan lines 320a and 320b arranged in row direction (only two scan lines shown in FIG. 1B), a plurality of data lines 330a and 330b arranged in column direction (only two data lines shown in FIG. 1B), a plurality of pixel units 340a and a plurality of pre-charge components 350. The scan lines 320a, 320b and the data lines 330a, 330b cross to each other to define a pixel unit 340a. The scan lines 320a and 320b, the data lines 330a and 330b and the pixel units 340a are all disposed on the substrate 310. The pixel units 340a are electrically connected with the corresponding scan lines (e.g. the scan lines 320a or 320b) and the corresponding data lines (e.g. the data lines 330a or 330b) respectively.

Each of the pixel units 340a includes an active device 342 and a pixel electrode 344. In each of the pixel units 340a, the active device 342 is electrically connected with the corresponding scan line 320a (or 320b), data line 330a (or 330b) and pixel electrode 344 (as shown in FIG. 1B). The active device 342 is a thin-film transistor (TFT), for example, and a liquid crystal capacitor $C_{LC}$ can be formed by the pixel electrode 344, the liquid crystal layer 400 and the common electrode 230. When each of the pixel units 340a is charged, an electric field can be generated so as to drive liquid crystal molecules between the common electrode 230 and the pixel electrode 344.

Each of the pre-charge components 350 is electrically connected with one of the scan lines 320a and two adjacent pixel electrodes 344 controlled by the next scan line 320b (as shown in FIG. 1B). In other words, from the perspective view of the pixel unit 340a, the pre-charge component 350 is electrically connected with the preceding scan line 320a and the pixel electrodes 344 that are controlled by scan line 320b. The pre-charge component 350 can be a TFT having a gate 350a, a drain 350b and a source 350c. The gate 350a is electrically connected with the scan line 320a, and the drain 350b and the source 350c are electrically connected with the two adjacent pixel electrodes 344 controlled by the next scan line 320b respectively.

In the present embodiment, each of the pixel units 340a can further include a storage capacitor 346a electrically connected with the active device 342 via the pixel electrode 344. In the present embodiment, the storage capacitors 346a are capacitors on the scan lines 320a. In other words, the storage capacitor 346a can be formed on the scan line 320a, that is, the storage capacitor 346a can be formed by the preceding scan line 320a and the pixel electrode 344 of the pixel unit 340a. However, although only the storage capacitor 346a formed on the scan line 320a is shown in FIG. 1B, the storage capacitor 346a of FIG. 1B is merely illustrated as an example and not intended to limit the present invention. In addition, the storage capacitor 346a can be arranged in the structure of metal layer/insulator layer/indium tin oxide (ITO) layer (MII), or metal layer/insulator layer/metal layer (MIM).

A driving method of the LCD panel 100a of the first embodiment will be described accompanied with FIG. 1B hereinafter. As for the driving method of the LCD panel 101a of the present embodiment, first, the pixel units 340a on the same row controlled by each of the scan lines (e.g. 320a or 320b) are charged so as to drive the LCD panel 100a. Herein, the pixel units 340a can be charged via some methods, such as column inversion driving method, dot inversion driving method or other proper driving methods.

When the pixel unit 340a controlled by one of the scan lines 320a is charged, the pre-charge component 350 electrically connected with the scan line 320a is turned on via the scan line 320a. When the pre-charge component 350 is turned on, the two adjacent pixel electrodes 344 electrically connected with the pre-charge component 350 can be conducted to each other. Thus, the charges of the two adjacent pixel electrodes 344 are shared with each other and have the same voltage level, so that the effect of pre-charging the adjacent pixel electrodes 344 can be achieved. Therefore, the pixel unit 340a controlled by the next scan line 320b is pre-charged by the pre-charge component 350. Once the pixel unit 340a has been pre-charged, it can be quickly charged to drive the liquid crystal molecules corresponding to the pixel unit 340a.

FIG. 2 is a schematic circuit diagram illustrating two adjacent pixel units on the same row of the LCD panel according to the second embodiment of the present invention. Referring to FIG. 2, the present embodiment is similar to the first embodiment, and the main difference between the present embodiment and the first embodiment is that a LCD panel 100b of the second embodiment includes a plurality of common lines 360 disposed on the substrate 310 and a storage capacitor 346b disposed in each of the pixel units 340b.

Specifically, each of the common lines 360 is arranged between two adjacent scan lines (e.g. between scan lines 320a and 320b), and the storage capacitor 346b disposed in each of the pixel units 340b is a capacitor on the common line 360. In other words, the storage capacitor 346b disposed in each of the pixel units 340b is formed by the pixel electrode 344 and the common line 360. That is, the storage capacitor 346b is formed on the common line 360, as shown in FIG. 2. In addition, the storage capacitor 346b can be arranged in the structure of metal layer/insulator layer/ITO layer (MII), or metal layer/insulator layer/metal layer (MIM). The driving method, structure and effect of the LCD panel 100b in the present embodiment are similar to those in the first embodiment and thus will no longer be repeated hereinafter.

Figure 3A:
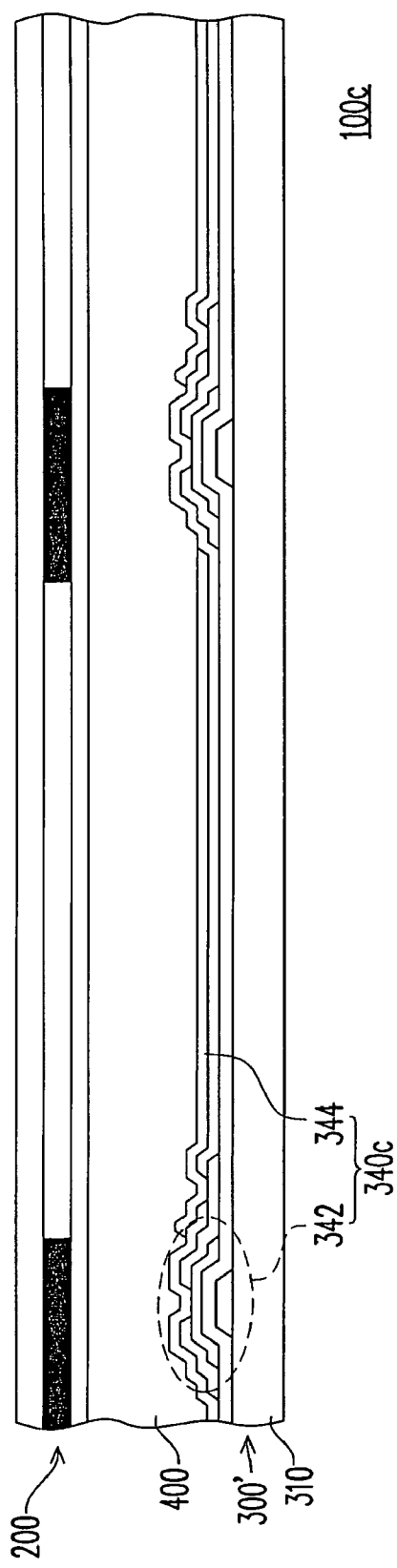
FIG. 3A is a schematic cross-sectional view of the LCD panel according to the third embodiment of the present invention.
Figure 3B:
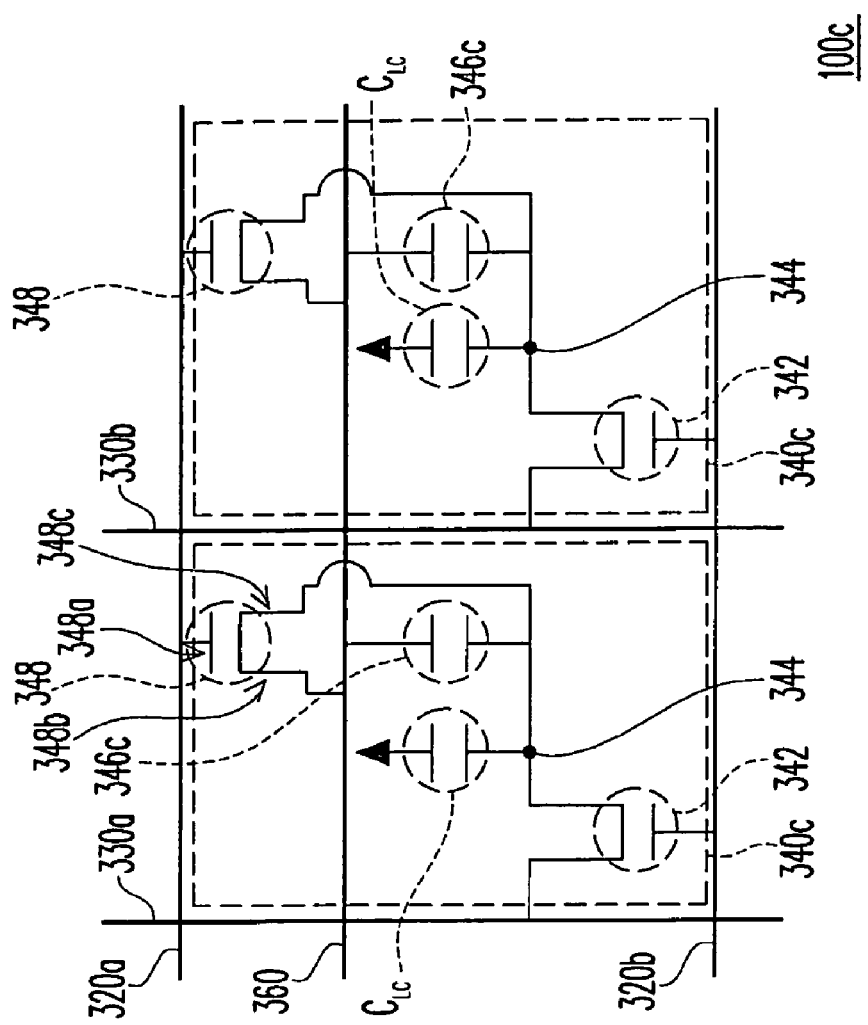
FIG. 3B is a schematic circuit diagram illustrating two adjacent pixel units on the same row of the LCD panel in FIG. 3A.

FIG. 3A is a schematic cross-sectional view of an LCD panel according to the third embodiment of the present invention. FIG. 3B is a schematic circuit diagram illustrating two adjacent pixel units on the same row of the LCD panel in FIG. 3A. Referring to both FIG. 3A and FIG. 3B, an LCD panel 100c includes an opposite substrate 200, an active matrix substrate 300' and a liquid crystal layer 400. The opposite substrate 200 is disposed above the active matrix substrate 300', and the liquid crystal layer 400 is disposed between the active matrix substrate 300' and the opposite substrate 200.

The active matrix substrate 300' includes a substrate 310, a plurality of scan lines 320a and 320b (only two scan lines shown in FIG. 3B), a plurality of data lines 330a and 330b (only two data lines shown in FIG. 3B), a plurality of pixel units 340c and a plurality of common lines 360. The scan lines (including 320a and 320b), the data lines (including 330a and 330b), the pixel units 340c and the common lines 360 are all disposed on the substrate 310. The plurality of the pixel units 340c are electrically connected with the corresponding scan lines (e.g. scan lines 320a or 320b) and the data lines (e.g. data lines 330a or 330b) respectively. The common lines 360 are disposed between two adjacent scan lines (e.g. between the scan lines 320a and 320b).

Each of the pixel units 340c includes an active device 342, a pixel electrode 344 and a pre-charge component 348. In each of the pixel units 340c, the active device 342 is electrically connected with the corresponding scan line 320b (or 320a), the data line 330a (or 330b) and the pixel electrode 344 (as shown in FIG. 3B). The active device 342 is a TFT, for example. Each of the pre-charge components 348 is electrically connected with the preceding scan line 320a of the pixel unit 340c, the pixel electrode 344 and the common line 360. The pre-charge component 348 can be a TFT having a gate 348a, a drain 348b and a source 348c. The gate 348a is electrically connected with the preceding scan line 320a, and the drain 348b and the source 348c are electrically connected with the common line 360 and the corresponding pixel electrode 344 respectively.

In the present embodiment, each of the pixel units 340c can further include a storage capacitor 346c electrically connected with the active device 342 via the pixel electrode 344. The storage capacitor 346c can be formed on the common line 360. In addition, the storage capacitor 346c can be arranged in the structure of metal layer/insulator layer/ITO layer (MII), or metal layer/insulator layer/metal layer (MIM).

The driving method of the LCD panel in the present embodiment is similar to the first embodiment, and the present invention will no longer be repeated hereinafter. The two embodiments merely differ in the method for the pre-charge component 348 to pre-charge the pixel unit 340c.

For example, in each of the pixel units 340c, when the pre-charge component 348 is turned on via the scan line 320a electrically connected therewith, the pixel electrode 344 can have the same voltage level as the common line 360, that is, the voltage level of the pixel electrode 344 can be equal to common voltage level of the common line 360. Thus, with the pre-charge component 348, the pixel unit 340c is pre-charged so as to mitigate the problem of insufficient charging.

Figure 4:
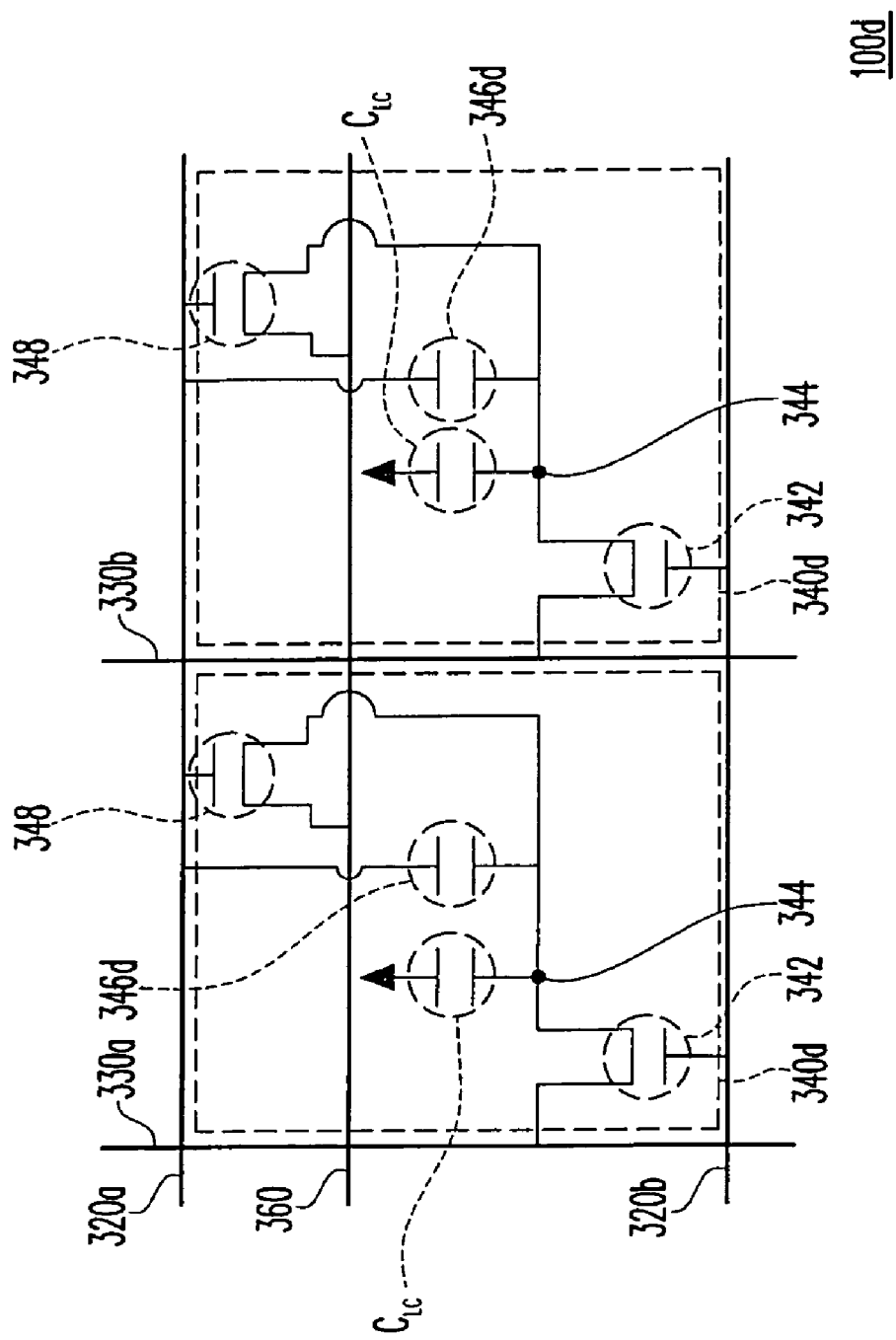
FIG. 4 is a schematic circuit diagram illustrating two adjacent pixel units on the same row of the LCD panel according to the forth embodiment of the present invention.

FIG. 4 is a schematic circuit diagram illustrating two adjacent pixel units on the same row of the LCD panel according to the forth embodiment of the present invention. Referring to FIG. 4, the present embodiment is similar to the third embodiment. The difference between the present embodiment and the third embodiment is that there are a plurality of pixel units 340d in a LCD panel 100d of the forth embodiment.

Specifically, the storage capacitor 346d in each of the pixel units 340d is basically formed by the pixel electrode 344 and the scan line 320a. That is, the storage capacitor 346d is formed on the scan line 320a. Although only the storage capacitor 346d formed on the scan line 320a is shown in FIG. 4, the storage capacitor 346d shown in FIG. 4 is merely illustrated as an example and not intended to limit the present invention. In addition, the storage capacitor 346d can be arranged in the structure of metal layer/insulator layer/ITO layer (MII) or metal layer/insulator layer/metal layer (MIM).

The driving method, structure and effect of the LCD panel 100d in the present embodiment are similar to the third embodiment, which thus will no longer be repeated hereinafter.

In view of the foregoing, with a plurality of pre-charge components, the pixel units in the LCD panel are able to be pre-charged before being charged, and therefore, the display quality of the LCD panel can be enhanced. In addition, since the present invention can achieve the effect of pre-charging without adopting complicated circuits, the present invention is more simple and useful than the conventional technique.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An active matrix substrate, comprising:
    a plurality of scan lines arranged in a first direction and a plurality of data lines arranged in a second direction to define a plurality of pixel units, each of the pixel units comprises:
        an active device, electrically connected with the corresponding scan line and the corresponding data line; and
        a pixel electrode, electrically connected to the active device; and
    a plurality of pre-charge components, wherein each of the pre-charge components is electrically connected with one of the scan lines and two adjacent pixel electrodes controlled by a next scan line thereof, wherein the two adjacent pixel electrodes electrically connected with each of the pre-charge components have the same voltage level when each of the pre-charge components is turned on via the scan line electrically connected therewith.

2. The active matrix substrate of claim 1, wherein the pre-charge component is a TFT having a gate, a drain and a source, wherein the gate is electrically connected with the scan line, and the drain and the source are electrically connected with the two adjacent pixel electrodes controlled by the next scan line respectively.

3. The active matrix substrate of claim 1, wherein each of the pixel units further comprises a storage capacitor electrically connected with the active device via the pixel electrode.

4. The active matrix substrate of claim 3, further comprising a plurality of common lines disposed on the substrate, wherein each of the common lines is arranged between two adjacent scan lines, and the storage capacitor is formed by the common lines and the pixel electrode.

5. A liquid crystal display (LCD) panel, comprising:
    an active matrix substrate, comprising:
        a plurality of scan lines and a plurality of data lines arranged crossing to each other to define a plurality of pixel units, each of the pixel units comprises:
            an active device, electrically connected with the scan line and the data line; and
            a pixel electrode, electrically connected with the active device;
        a plurality of pre-charge components, wherein each of the pre-charge components is electrically connected with one of the scan lines and two adjacent pixel electrodes controlled by the next scan line thereof, wherein the two adjacent pixel electrodes electrically connected with each of the pre-charge components have the same voltage level when each of the pre-charge components is turned on via the scan line electrically connected therewith;

an opposite substrate, disposed above the active matrix substrate; and a liquid crystal layer, disposed between the active matrix substrate and the opposite substrate.

6. The LCD panel of claim 5, wherein the pre-charge component is a TFT having a gate, a drain and a source, wherein the gate is electrically connected with the scan line, and the drain and the source are electrically connected with the two adjacent pixel electrodes controlled by the next scan line respectively.

7. The LCD panel of claim 5, wherein the active matrix substrate further comprises a plurality of common lines disposed on the substrate, wherein the common lines are arranged between two adjacent scan lines, and each of the pixel units further comprises a storage capacitor that is formed by one of the common line and the pixel electrode.

* * * * *